United States Patent [19]

Machida

[11] 4,390,972
[45] Jun. 28, 1983

[54] REFRESHING SYSTEM FOR DYNAMIC MEMORY

[75] Inventor: Minoru Machida, Tokyo, Japan

[73] Assignee: Canon Kabushiki Kaisha, Tokyo, Japan

[21] Appl. No.: 209,499

[22] Filed: Nov. 24, 1980

[30] Foreign Application Priority Data

Nov. 29, 1979 [JP] Japan ................. 54/153674

[51] Int. Cl.³ ........................... G11C 13/00
[52] U.S. Cl. .................. 365/222; 365/212; 365/229; 371/10
[58] Field of Search ........... 365/211, 212, 222, 226, 365/227, 228, 229; 371/10, 71

[56] References Cited

U.S. PATENT DOCUMENTS 3,705,392 12/1972 Appelt ......................... 365/227
3,835,458 9/1974 Mrazek ........................ 365/211
3,851,316 11/1974 Kodama ....................... 365/212

Primary Examiner—Terrell W. Fears
Attorney, Agent, or Firm—Fitzpatrick, Cella, Harper & Scinto

[57] ABSTRACT

An oscillator of a pulse generator for use in a system for refreshing a dynamic memory comprises an operational amplifier having first and second input terminals and an output terminal, a thermistor connected between the first input terminal and the output terminal, a capacitor connected between the first input terminal and a ground, and four resistors. A first resistor is connected between the second input terminal and the output terminal. A second resistor is connected between the second input terminal and the ground. A third resistor is connected between the second input terminal and a power supply. A fourth resistor is connected between the output terminal and power supply.

2 Claims, 4 Drawing Figures

REFRESHING SYSTEM FOR DYNAMIC MEMORY

BACKGROUND OF THE INVENTION

1. Field of the Invention

The present invention relates to a refreshing system for dynamic memory, and more particularly to a system that the refresh request frequency is made variable according to the ambient temperature thereby improving the throughput of the system having such memory.

2. Description of the Prior Art

In the conventional refreshing system of a dynamic memory, the central processing unit, upon granting the request for refreshing from the memory, transfers the bus line control to the memory during the refreshing cycle. Now reference is made to FIG. 1 for explaining such a conventional refreshing system in which there is shown a refresh clock generator RCG composed, for example, of an astable multivibrator, a dynamic random access memory DRM, a dynamic RAM controller DRC composed, for example of Motorola MC3480, for controlling said memory DRM, a counter RCT for generating the address of the random access memory DRM to be refreshed, an address multiplexer MPX for switching the address information released from the central processing unit CPU through an address bus B1, a counter output signal released from the refresh counter through a refresh bus B2 in response to a refresh signal REF from the controller DRC, a data bus B3 between the memory DRM and the central processing unit CPU, a row address strobe signal line $\overline{RAS}$, a column address strobe signal line CAS, and signal lines S1–S5.

The refresh clock generator RCG supplies, through the signal line S1 to the controller DRC and the refresh counter RCT, refresh clock pulses RC of a determined frequency as shown in FIG. 2. In response to the leading edge of each refresh clock pulse RC, the controller RC generates a refresh request signal RREQ as shown in FIG. 2 which is supplied to the central processing unit CPU through the signal line S2. In response to said refresh request signal RREQ, the central processing unit CPU grants the transfer of bus line control to the memory and releases a refresh grant signal RGRT shown in FIG. 2 to the controller DRC through the signal line S3. In response to the trailing edge of said grant signal RGRT, the controller DRC releases a refresh signal REF shown in FIG. 2 through the signal line S4 to the address multiplexer MPX which is thus switched from the CPU address bus line B1 to the RCT bus line B2. The memory DRM is refreshed while it is switched to the bus line B2. Also the refresh counter RCT is step advanced at the trailing edge of the refresh clock pulse RC to retain the succeeding refresh address. The signal line S5 is utilized for sending the read/write signal R/W from the central processing unit CPU to the memory DRM.

Such a conventional refreshing method as explained above is defective in that the refreshing interval of the dynamic RAM varies depending on the ambient temperature. As an example, the curve A in FIG. 3 shows the relation between the refreshing interval (R.I.) and the ambient temperature (Ta) in case of a 4K-bit dynamic RAM 2107A supplied by Intel Corp. As will be seen from this curve, the refreshing interval, which is as short as 10 ms at 70° C., becomes as sixty times long as 600 ms at 0° C.

SUMMARY OF THE INVENTION

An object of the present invention is to provide a refreshing system for a dynamic memory in which the interval of the refreshing clock pulses is varied in response to the change in the ambient temperature thereby minimizing the time in which the bus line is occupied for the memory refreshing at each temperature and thus improving the system throughput.

DESCRIPTION OF THE PREFERRED EMBODIMENTS

According to the present invention, utilizing the fact that the refreshing interval of dynamic random access memory is dependent on ambient temperature, the frequency of the refresh request signal RREQ sent to the CPU or of the refresh clock generator RCG is regulated according to the ambient temperature thereby minimizing, for each temperature, the occupied time of the bus line for refreshing.

Figure 4:
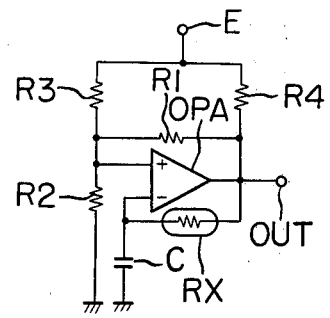
FIG. 4 is a circuit diagram showing an example of the refresh clock pulse generating circuit embodying the present invention.

As an example of the means for regulating the frequency or repetition rate of the refresh clock generator RCG according to the ambient temperature, FIG. 4 shows the circuit structure of an oscillator to be incorporated in said clock generator RCG. In FIG. 4 there are shown an operational amplifier OPA, resistors R1–R4, a thermo-sensitive element Rx such as a thermistor, a capacitor C, a power supply input terminal E and an output terminal OUT. The oscillation frequency is determined by the capacitor C and the thermistor Rx for given values of resistors R1–R4.

Figure 1:
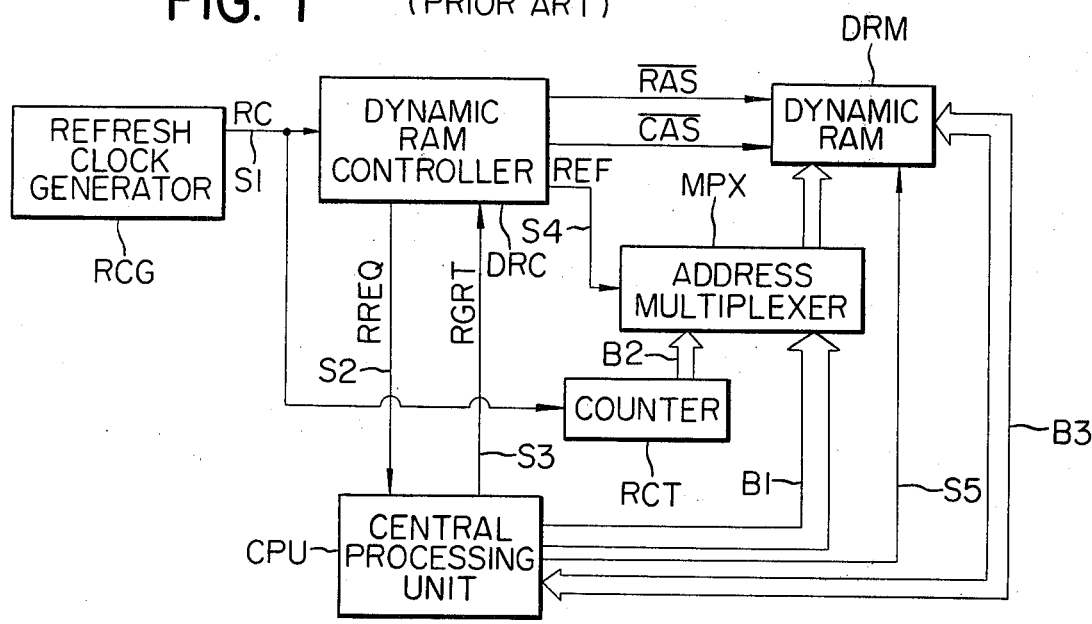
FIG. 1 is a block diagram showing an example of the conventional refreshing circuit for dynamic RAM.
Figure 2:
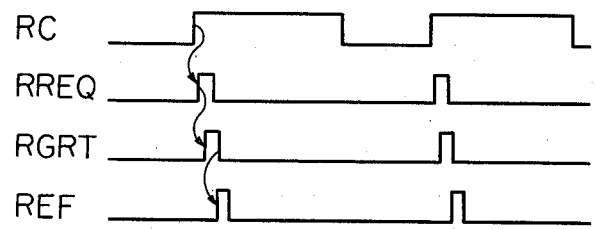
FIG. 2 is a timing chart showing the function of the circuit shown in FIG. 1.
Figure 3:
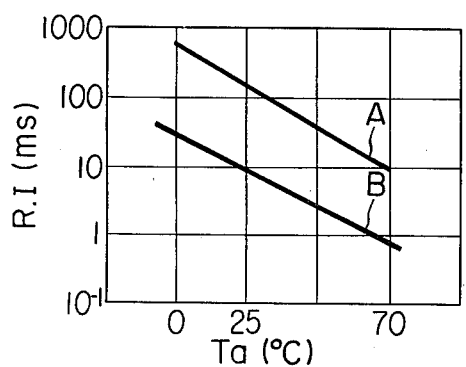
FIG. 3 is a chart showing the temperature characteristic of refreshing interval of dynamic RAM.

According to the present invention, the oscillation frequency obtained at the output terminal OUT varies according to the change in resistance of the thermistor Rx in response to the ambient temperature. As an example, in case said oscillator is composed with the following parameters:

power supply: 5 V
R1: 47 kΩ
R2: 100 kΩ
R3: 100 kΩ
R4: 18 kΩ
C: 680 pF
Rx: a thermistor of 33 kΩ, for example ERT-D2FHL333S; Matsushita Electric
OPA: an ordinary operational amplifier, the refresh interval becomes 30 ms, 9 ms and 2.5 ms, respectively, at 0°, 25° and 55° C. to assume the behavior shown by the curve B in FIG. 3, which is substantially parallel to the curve A showing the temperature-refresh interval relationship of dynamic RAM. Thus, according to the present invention, it is rendered possible, by employing the above-mentioned oscillator and utilizing the oscillation output thereof as the refresh clock pulses RC for the dynamic RAM, to match the interval of the refreshing signals with the refreshing interval of dynamic memories thereby minimizing the refreshing operations according to the ambient temperature.

As explained in the foregoing, the present invention utilizing the fact that the refresh interval of dynamic random access memory is variable, depending on the ambient temperature, controls the frequency of the refresh request signals in response to the ambient temperature to constantly realize in optimum refresh interval for each temperature thereby minimizing the occupied time of bus line for refreshing and thus improving the system throughput.

What I claim is:

1. An oscillator of a pulse generator for use in a system for refreshing a dynamic memory comprising:

an operational amplifier having a first input terminal and a second input terminal and an output terminal;
a thermistor connected between the first input terminal and the output terminal;
a capacitor connected between the first input terminal and a ground;
a first resistor connected between the second input terminal and the output terminal;
a second resistor connected between the second input terminal and the ground;
a third resistor connected between the second input terminal and a power supply; and
a fourth resistor connected between the output terminal and the power supply.

2. A pulse generator according to claim 1, wherein said dynamic memory comprises a random access memory.

* * * * *